United States Patent
Homer et al.

(10) Patent No.: US 8,457,259 B2
(45) Date of Patent: Jun. 4, 2013

(54) METHOD AND SYSTEM FOR PARTITIONING GAIN FOR WIRELESS RADIO FREQUENCY INTEGRATED CIRCUITS

(75) Inventors: Johnny T. Homer, Plano, TX (US); William M. Hurley, Murphy, TX (US); Lup M. Loh, Plano, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 1326 days.

(21) Appl. No.: 11/487,831

(22) Filed: Jul. 17, 2006

(65) Prior Publication Data

US 2008/0014889 A1   Jan. 17, 2008

(51) Int. Cl.
*H04L 27/08* (2006.01)
(52) U.S. Cl.
USPC ........... 375/345; 375/316; 375/297; 375/344; 375/296; 375/318

(58) Field of Classification Search
USPC .. 375/345, 316, 297, 344, 296, 318; 455/127, 455/232, 240
See application file for complete search history.

(56) References Cited

U.S. PATENT DOCUMENTS

| | | | |
|---|---|---|---|
| 2003/0083031 A1* | 5/2003 | Eriksson et al. | 455/250.1 |
| 2003/0156667 A1* | 8/2003 | Nishio | 375/345 |
| 2004/0097209 A1* | 5/2004 | Haub et al. | 455/242.1 |
| 2006/0132235 A1* | 6/2006 | Ozawa | 330/254 |
| 2007/0001880 A1* | 1/2007 | Gierenz et al. | 341/118 |
| 2009/0068967 A1* | 3/2009 | Matsui et al. | 455/127.3 |

FOREIGN PATENT DOCUMENTS

JP   2001211218 A   *   8/2001

* cited by examiner

*Primary Examiner* — Zewdu Kassa (57) ABSTRACT

A method for partitioning gain for a wireless radio frequency integrated circuit (RFIC) is provided. The method includes receiving an overall gain at the RFIC from a baseband controller that is coupled to the RFIC. The overall gain is then partitioned in the RFIC.

20 Claims, 5 Drawing Sheets

METHOD AND SYSTEM FOR PARTITIONING GAIN FOR WIRELESS RADIO FREQUENCY INTEGRATED CIRCUITS

CROSS-REFERENCE TO RELATED APPLICATION(S)

The present application is related to U.S. patent application Ser. No. 11/487,822, titled "Method and System for Converting Logarithmic Values into Linear Values in Digital Logic," filed concurrently herewith. Patent application Ser. No. 11/487,822 is assigned to the assignee of the present application. The subject matter disclosed in patent application Ser. No. 11/487,822 is hereby incorporated by reference into the present disclosure as if fully set forth herein.

TECHNICAL FIELD OF THE INVENTION

The present application relates generally to integrated circuits and, more specifically, to a method and system for partitioning gain for wireless radio frequency integrated circuits.

BACKGROUND OF THE INVENTION

The proliferation of competitors within the wireless market has placed increased cost pressures on wireless terminal manufacturers. Thus, increased functionality at reduced cost is a primary driver in wireless component development. This has forced digital technologies to increasingly encroach into analog devices, generally increasing device complexities but also providing opportunities for increased functionality.

A typical wireless terminal platform includes an integrated device performing modem and application layer functions and a radio frequency integrated circuit (RFIC) that performs RF to baseband/IF functions. Communication between the controlling device and the RFIC is typically via a low-bandwidth serial channel. Thus, for recurring communications, such as receive gain control adjustments due to environment changes, it is desirable to limit the amount of information to be transferred.

However, typical RFIC gain is distributed to multiple stages within the receive chain, resulting in a large number of transactions needed to provide gain control. Furthermore, because the gain stages are individually controlled, the partitioning must be calculated by the modem for every change. Because the modem generally has to send a separate gain update to the RFIC for each gain stage, the overall change in the gain of the RFIC is unsettled as the individual changes are transmitted. Also, during this unsettled period, the communications channel is unavailable for other control signals, possibly affecting time critical commands to other channels. For standard applications in which gain updates are performed on the order of every 10 s of microseconds, bandwidth and processing must be minimized. Therefore, there is a need in the art for an improved method of providing gain control in the RFIC.

SUMMARY OF THE INVENTION

A method for partitioning gain for a wireless radio frequency integrated circuit (RFIC) is provided. According to an advantageous embodiment of the present disclosure, the method includes receiving an overall gain at the RFIC from a baseband controller that is coupled to the RFIC. The overall gain is then partitioned in the RFIC.

According to another embodiment of the present disclosure, an RFIC is provided that includes a plurality of amplifiers and a gain partitioning block. The gain partitioning block is coupled to the amplifiers and is operable to partition an overall gain for the RFIC into an individual gain for each of the amplifiers.

According to yet another embodiment of the present disclosure, a mobile station is provided that includes a baseband controller and an RFIC coupled to the baseband controller. The baseband controller is operable to determine an overall gain. The RFIC comprises a gain partitioning block and a plurality of amplifiers and is operable to receive the overall gain from the baseband controller. The gain partitioning block is operable to partition the overall gain into an individual gain for each of the amplifiers.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or" is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged integrated circuit.

Figure 1:
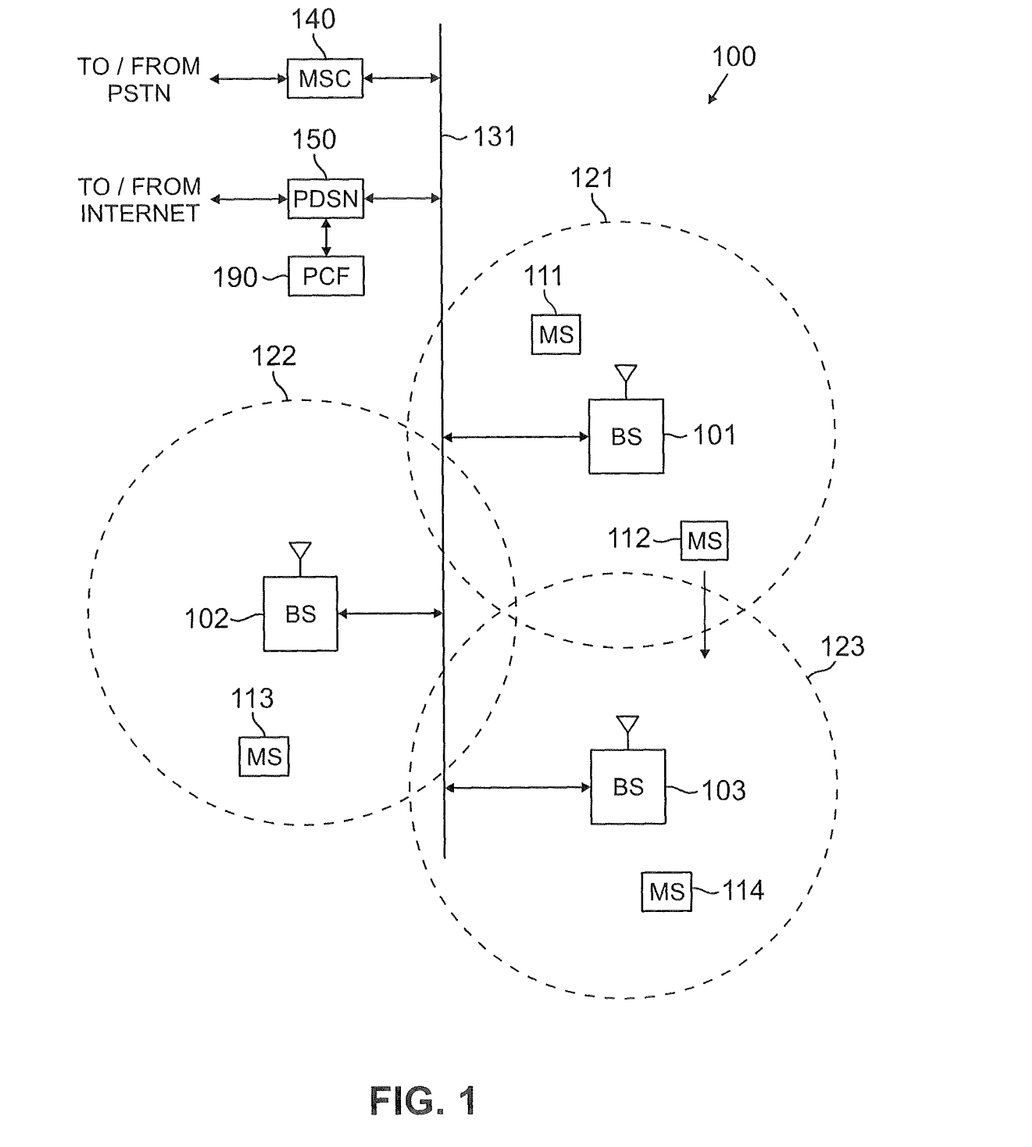
FIG. 1 illustrates a wireless network including mobile stations having radio frequency integrated circuits (RFICs) capable of partitioning gain according to one embodiment of the disclosure.

FIG. 1 illustrates a wireless network 100 including mobile stations having radio frequency integrated circuits (RFICs) capable of partitioning gain according to one embodiment of the disclosure. Wireless network 100 comprises a plurality of cells (or cell sites) 121-123, each containing one of the base stations, BS 101, BS 102, or BS 103. Base stations 101-103 communicate with a plurality of mobile stations (MS) 111-114 over code division multiple access (CDMA) channels according to, for example, the IS-2000 standard (i.e., CDMA2000). In an advantageous embodiment of the present disclosure, mobile stations 111-114 are capable of receiving data traffic and/or voice traffic on two or more CDMA channels simultaneously. Mobile stations 111-114 may be any suitable wireless devices (e.g., conventional cell phones, PCS handsets, personal digital assistant (PDA) handsets, portable computers, telemetry devices) that are capable of communicating with base stations 101-103 via wireless links.

The present disclosure is not limited to mobile devices. The present disclosure also encompasses other types of wireless access terminals, including fixed wireless terminals. For the sake of simplicity, only mobile stations are shown and discussed hereafter. However, it should be understood that the use of the term "mobile station" in the claims and in the description below is intended to encompass both truly mobile devices (e.g., cell phones, wireless laptops) and stationary wireless terminals (e.g., a machine monitor with wireless capability).

As described in more detail below, a mobile station 111-114 includes a baseband controller and a radio frequency integrated circuit (RFIC) that is capable of performing RF to baseband/IF functions. Communication between these components is performed over a low-bandwidth serial channel. In typical mobile stations, RFIC gain is distributed to multiple stages within the receive chain, resulting in a large number of transactions from the baseband controller to the RFIC in order to provide gain control. In addition, the gain stages are individually controlled such that the partitioning is calculated by the baseband controller for every change.

A conventional method of dealing with multiple gain stages includes multiple controlling registers, with one or more registers controlling each gain stage. This allows for fine resolution and control of many gain stages. However, the partitioning is calculated for every update, and each gain stage requires a separate transaction or multiple transactions. Further, for this method, the overall gain is changed over a large number of microseconds as each serial transaction completes. Therefore, if the baseband controller decides to make a gain change, then the transition from one gain state to another occurs over a significant period of time, adversely affecting the signal quaility during the intermediate states of the switch. This can also contribute to increased bit error rates.

Another conventional method of controlling gain stages focuses on using one or a small number of registers to control multiple gain stages but at the expense of decreased resolution for each stage. The baseband controller calculates the gain partitioning, but the results may be concatenated and written during one transaction. However, in order to reduce the information during such a transaction, the resolution for gain control is compromised.

Thus, in accordance with the present disclosure, any one or more of the mobile stations 111-114 in wireless network 100 (in addition to any one or more of base stations 101-103) may be operable to provide an overall gain from the baseband controller to the RFIC and to allow the RFIC to perform the gain partitioning for the multiple stages. In this way, communication bandwidth used for gain updates may be limited to a single transaction that provides the overall RFIC gain. Furthermore, the gain is partitioned not by silicon-hungry look-up tables but by well chosen logic, limiting the resources used for partitioning. In addition, by receiving one gain change command at the RFIC, partitioning internally, and distributing to various gain stages simultaneously, intermediate gain states are minimized. As used herein, "simultaneously" means virtually simultaneously (in other words, within a few microseconds).

Dotted lines show the approximate boundaries of cells (or cell sites) 121-123 in which base stations 101-103 are located. It is noted that the terms "cells" and "cell sites" may be used interchangeably in common practice. For simplicity, the term "cell" will be used hereafter. The cells are shown approximately circular for the purposes of illustration and explanation only. It should be clearly understood that the cells may have other irregular shapes, depending on the cell configuration selected and variations in the radio environment associated with natural and man-made obstructions.

As is well known in the art, each of cells 121-123 is comprised of a plurality of sectors, where a directional antenna coupled to the base station illuminates each sector. The embodiment of FIG. 1 illustrates the base station in the center of the cell. Alternate embodiments may position the directional antennas in corners of the sectors. The system of the present disclosure is not limited to any particular cell configuration.

In one embodiment of the present disclosure, each of BS 101, BS 102 and BS 103 comprises a base station controller (BSC) and one or more base transceiver subsystem(s) (BTS). Base station controllers and base transceiver subsystems are well known to those skilled in the art. A base station controller is a device that manages wireless communications resources, including the base transceiver subsystems, for specified cells within a wireless communications network. A base transceiver subsystem comprises the radio frequency (RF) transceivers, antennas, and other electrical equipment located in each cell. This equipment may include air conditioning units, heating units, electrical supplies, telephone line interfaces and RF transmitters and RF receivers. For the purpose of simplicity and clarity in explaining the operation of the present disclosure, the base transceiver subsystems in each of cells 121, 122 and 123 and the base station controller associated with each base transceiver subsystem are collectively represented by BS 101, BS 102 and BS 103, respectively.

BS 101, BS 102 and BS 103 transfer voice and data signals between each other and the public switched telephone network (PSTN) (not shown) via communication line 131 and mobile switching center (MSC) 140. BS 101, BS 102 and BS 103 also transfer data signals, such as packet data, with the Internet (not shown) via communication line 131 and packet data server node (PDSN) 150. Packet control function (PCF) unit 190 controls the flow of data packets between base stations 101-103 and PDSN 150. PCF unit 190 may be implemented as part of PDSN 150, as part of MSC 140, or as a stand-alone device that communicates with PDSN 150, as shown in FIG. 1. Line 131 also provides the connection path for control signals transmitted between MSC 140 and BS 101, BS 102 and BS 103 that establish connections for voice and data circuits between MSC 140 and BS 101, BS 102 and BS 103.

Communication line 131 may be any suitable connection means, including a T1 line, a T3 line, a fiber optic link, a network packet data backbone connection, or any other type of data connection. Alternatively, communication line 131 may be replaced by a wireless backhaul system, such as microwave transceivers. Communication line 131 links each vocoder in the BSC with switch elements in MSC 140. The connections on communication line 131 may transmit analog voice signals or digital voice signals in pulse code modulated (PCM) format, Internet Protocol (IP) format, asynchronous transfer mode (ATM) format, or the like.

MSC 140 is a switching device that provides services and coordination between the mobile stations in a wireless network and external networks, such as the PSTN or Internet. MSC 140 is well known to those skilled in the art. In some embodiments, communication line 131 may be several different data links where each data link couples one of BS 101, BS 102, or BS 103 to MSC 140.

In exemplary wireless network 100, MS 111 is located in cell 121 and is in communication with BS 101. MS 112 is also located in cell 121 and is in communication with BS 101. MS 113 is located in cell 122 and is in communication with BS 102. MS 114 is located in cell 123 and is in communication with BS 103. MS 112 is also located close to the edge of cell 123 and is moving in the direction of cell site 123, as indicated by the direction arrow proximate MS 112. At some point, as MS 112 moves into cell site 123 and out of cell site 121, a hand-off will occur.

Figure 2:
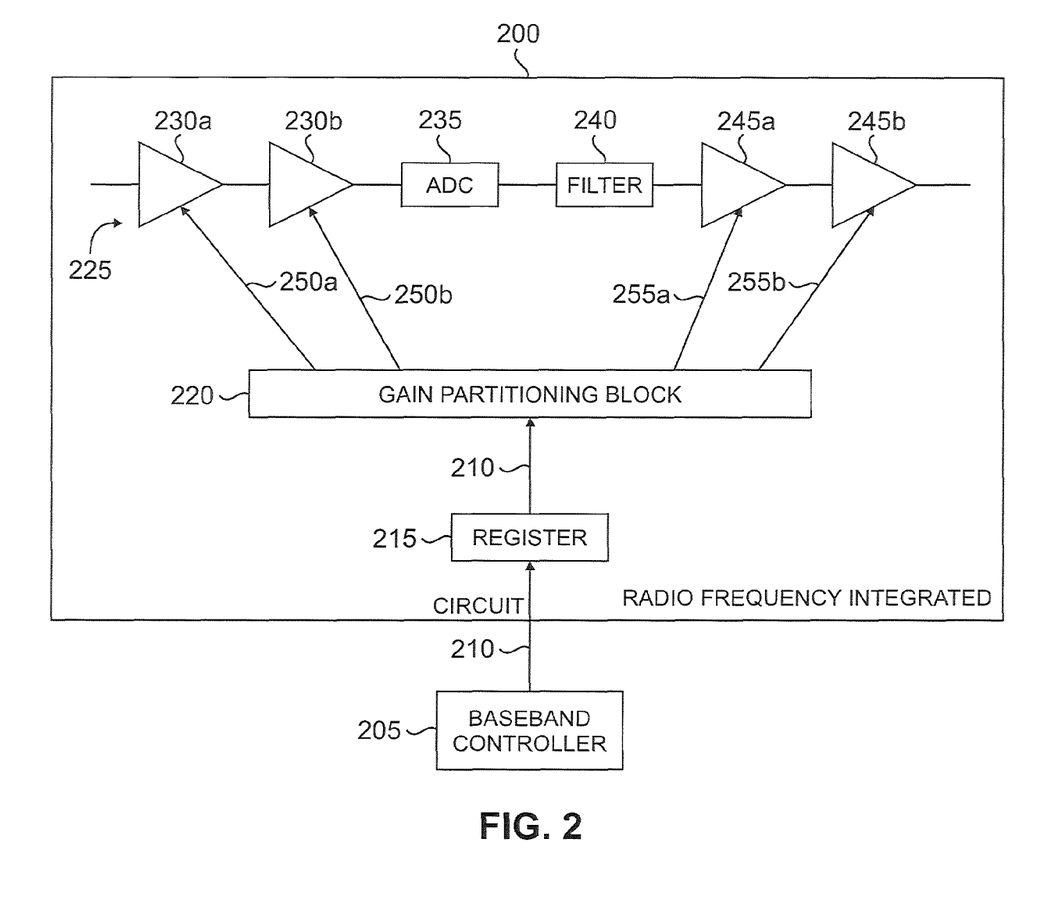
FIG. 2 illustrates an RFIC in one of the mobile stations of FIG. 1 that is operable to partition gain according to one embodiment of the disclosure.

FIG. 2 illustrates an RFIC 200 that may be implemented in one of the mobile stations 111-114 (or base stations 101-103) and that is operable to partition gain according to one embodiment of the disclosure. The RFIC 200 is coupled to a baseband controller 205 that is operable to determine an overall gain 210 for the RFIC 200 and to provide the overall gain 210 to the RFIC 200.

The RFIC 200 comprises a register 215, a gain partitioning block 220 and a communication chain. For the illustrated embodiment described below, the communication chain comprises a receive chain 225. The illustrated portion of the receive chain 225 comprises one or more analog amplifiers 230, an analog-to-digital converter 235, a filter 240, and one or more digital amplifiers 245.

For the embodiment in which the communication chain comprises a transmit chain, the transmit chain may comprise a digital-to-analog converter instead of an analog-to-digital converter 235, in addition to having other modifications as compared to the receive chain 225. It will be understood that the RFIC 200 may comprise both a transmit chain and a receive chain 225 and that the gain partitioning block 220 may be coupled to only the receive chain 225 or to both chains or that separate gain partitioning blocks 220 may be coupled to each of the chains. Furthermore, it will be understood that the receive chain 225, and the remainder of the RFIC 200, may comprise any other suitable components (not illustrated in FIG. 2).

For the illustrated embodiment, the baseband controller 205 is operable to provide the overall gain 210 to the register 215 of the RFIC 200. The register 215, which is coupled to the gain partitioning block 220, is operable to provide the overall gain 210 to the gain partitioning block 220. However, for some embodiments, the baseband controller 205 may be operable to provide the overall gain 210 directly to the gain partitioning block 220.

As described in more detail below in connection with FIGS. 3-5, the gain partitioning block 220 is operable to partition the overall gain 210 into a plurality of individual analog gains 250 for the analog amplifiers 230 and individual digital gains 255 for the digital amplifiers 245. The receive chain 225 is coupled to the gain partitioning block 220, and each amplifier 230 and 245 in the receive chain 225 is operable to receive a corresponding individual gain 250 or 255 from the gain partitioning block 220.

Thus, using this implementation of the RFIC 200, the baseband controller 205 need not partition the overall gain 210. This allows the baseband controller 205 to perform other functions with the processing power that otherwise would have been used for gain partitioning. In addition, even using a low-bandwidth control channel for communication between the RFIC 200 and the baseband controller 205, the small amount of gain information determined by the baseband controller 205 may be provided to the RFIC 200 relatively quickly. For a particular embodiment, the overall gain 210 may be provided to the RFIC 200 in a single transaction.

Furthermore, any changes in gain for the amplifiers 230 and 245 may be implemented relatively quickly (simultaneously for some embodiments) due to the gain partitioning block 220 being able to communicate updated gain information directly to the amplifiers 230 and 245 when the gain partitioning block 220 completes a gain partitioning process. Finally, for one embodiment, a translation layer (not illustrated in FIG. 2) may be coupled between the RFIC 200 and the baseband controller 205 in order to minimize or remove the need for software changes to a typical baseband controller 205 in implementing the illustrated RFIC 200.

Figure 3:
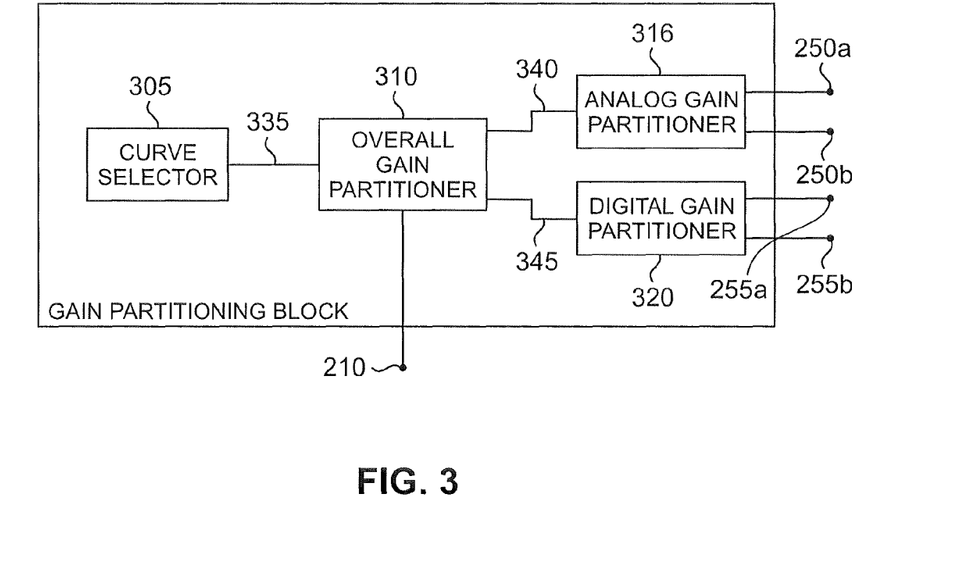
FIG. 3 illustrates details of the gain partitioning block of FIG. 2 according to one embodiment of the disclosure.

FIG. 3 illustrates details of the gain partitioning block 220 according to one embodiment of the disclosure. For one embodiment, the illustrated gain partitioning block 220 may be implemented as the gain partitioning block 220 of FIG. 2. However, it will be understood that the gain partitioning block 220 may be implemented in any other suitable manner. For example, the gain partitioning block 220 of FIG. 3 may be coupled to a transmit chain instead of the receive chain 225 illustrated in FIG. 2.

For the illustrated embodiment, the gain partitioning block 220 comprises an optional curve selector 305, an overall gain partitioner 310, an analog gain partitioner 315 and a digital gain partitioner 320. The curve selector 305 is operable to store a plurality of curve sets for use in gain partitioning. For the embodiment in which the optional curve selector 305 is omitted, the overall gain partitioner 310 may be operable to store a single curve set for use in gain partitioning. The curve selector 305 is operable to select one curve set from the plurality of stored curve sets based on an "air interface standard," a "wireless standard" or other suitable basis and to provide the selected curve set 335 to the overall gain partitioner 310.

The selected curve set 335 may comprise step values, breakpoints and/or other suitable characteristics for each of a plurality of curves. For example, FIG. 4 illustrates a graph of one example of a partitioning curve set 400 that may be selected by the curve selector 305 or stored in the overall gain partitioner 310 according to one embodiment of the disclosure. The curve set 400 comprises an overall gain curve 405, an analog gain curve 410 and a digital gain curve 415.

The overall gain partitioner 310 is coupled to the curve selector 305 and is operable to receive the selected curve set 335 from the curve selector 305 and to receive the overall gain 210. The overall gain partitioner 310 may receive the overall gain 210 from the register 215 or baseband controller 205. Alternatively, the curve selector 305 may receive the overall gain 210 from the register 215 or baseband controller 205, and the overall gain partitioner 310 may receive the overall gain 210 from the curve selector 305. The overall gain partitioner 310 is also operable to partition the overall gain 210 by identifying an overall analog gain 340 and an overall digital gain 345 based on the selected curve set 335.

Figure 4:
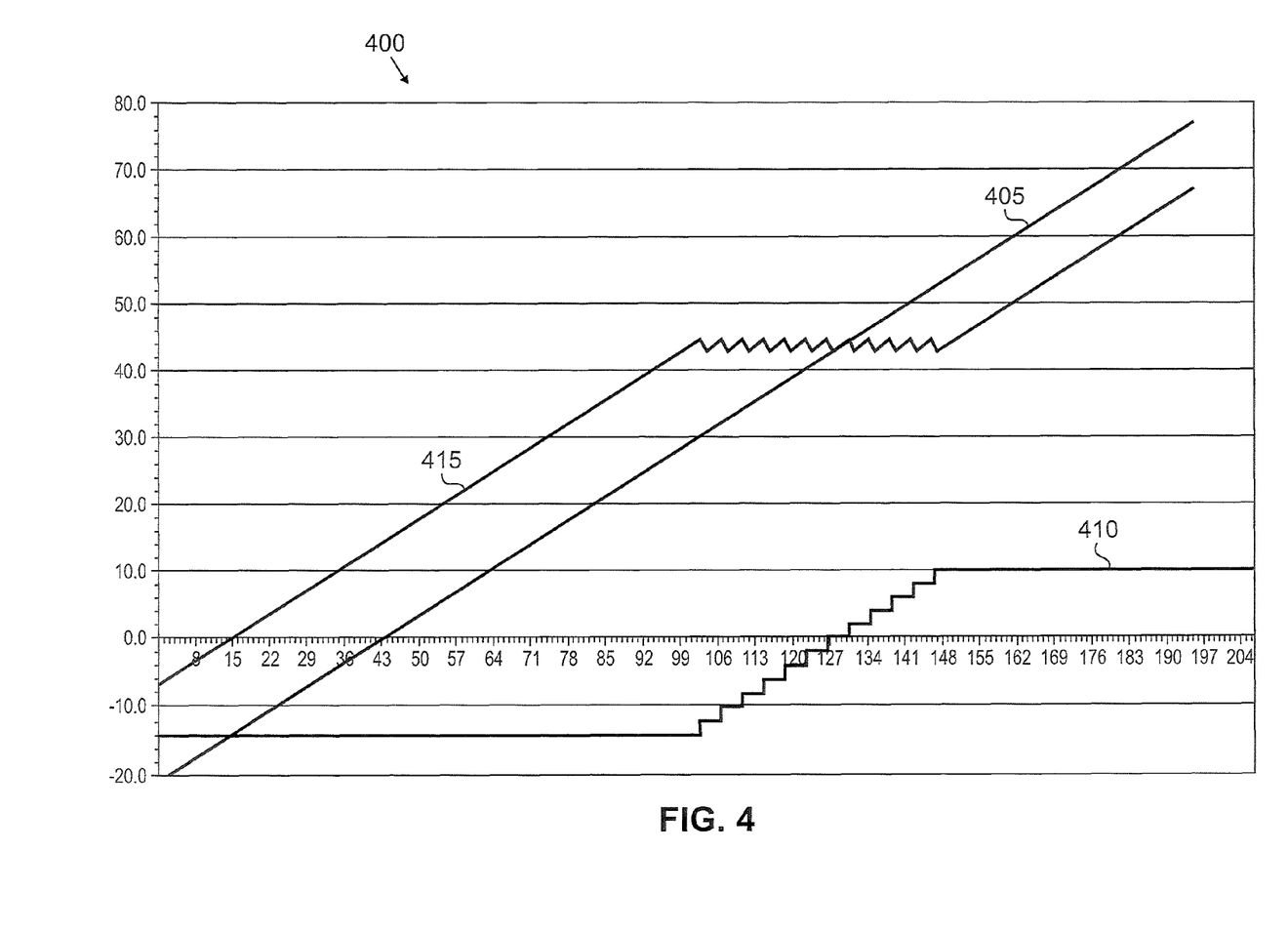
FIG. 4 illustrates a graph of one example of a partitioning curve set that may be selected by the curve selector of FIG. 3 according to one embodiment of the disclosure.

As an example, for one embodiment, the selected curve set 335 may comprise the curve set 400 illustrated in FIG. 4 and the overall gain 210 may comprise 20 dB. For this embodiment, the overall gain partitioner 310 identifies an overall analog gain 340 based on the analog gain curve 410 of −15 dB and an overall digital gain 345 based on the digital gain curve 415 of 35 dB.

The analog gain partitioner 315 is coupled to the overall gain partitioner 310 and is operable to receive the overall analog gain 340. The analog gain partitioner 315 is operable to partition the overall analog gain 340 into an individual analog gain 250 for each of the analog amplifiers 230 based on any suitable partitioning algorithm.

Thus, for the embodiment in which the receive chain 225 of the RFIC 200 comprises two analog amplifiers 230*a* and 230*b*, the analog gain partitioner 315 is operable to partition the overall analog gain 340 into two individual analog gains 250*a* and 250*b*, a first individual analog gain 250*a* for the first analog amplifier 230*a* and a second individual analog gain 250*b* for the second analog amplifier 230*b*. It will be understood that the analog gain partitioner 315 is operable to partition the overall analog gain 340 into any suitable number of individual analog gains 250 based on the number of analog amplifiers 230 in the receive chain 225 (and/or the transmit chain based on which embodiment of the gain partitioning block 220 is implemented).

The digital gain partitioner 320 is coupled to the overall gain partitioner 310 and is operable to receive the overall digital gain 345. The digital gain partitioner 320 is operable to partition the overall digital gain 345 into an individual digital gain 255 for each of the digital amplifiers 245 based on any suitable partitioning algorithm.

Thus, for the embodiment in which the receive chain 225 of the RFIC 200 comprises two digital amplifiers 245*a* and 245*b*, the digital gain partitioner 320 is operable to partition the overall digital gain 345 into two individual digital gains 255*a* and 255*b*, a first individual digital gain 255*a* for the first digital amplifier 245*a* and a second individual digital gain 255*b* for the second digital amplifier 245*b*. It will be understood that the digital gain partitioner 320 is operable to partition the overall digital gain 345 into any suitable number of individual digital gains 255 based on the number of digital amplifiers 245 in the receive chain 225 (and/or the transmit chain based on which embodiment of the gain partitioning block 220 is implemented).

Based on the particular curves 405, 410 and 415 included in each curve set 400 stored in the curve selector 305 or in the curve set stored in the overall gain partitioner 310, the silicon used to generate the various gains may be significantly reduced. For example, generating the curves 405, 410 and 415 from a collection of linear equations allows the gain calculation to be performed based only on breakpoints and step values.

Regarding bandwidth, for a particular example, the serial communication channel between the RFIC 200 and the baseband controller 205 operates at 6 MHz and each transaction includes 24 bits of information. In addition, the RFIC 200 for this example has two analog amplifiers 230*a* and 230*b* and two digital amplifiers 245*a* and 245*b*, with each amplifier 230 or 245 using a single serial transaction to update gain. For a gain update rate of once per 60 microseconds, updating the gain based on partitioning in the baseband controller 205 would use 16 microseconds of the 60 microsecond period. The result would be an unsettled gain change for 25% of the update period and consumption of 25% of the channel bandwidth. Furthermore, the complete consumption of the communications channel for 16 microseconds inserts possible latency in the control path, possibly affecting time critical commands to other channels, in the case of multi-channel RFICs.

However, with the same serial parameters but with the RFIC 200 comprising the gain partitioning block 220, the gain update uses only 4 microseconds of the 60 microsecond period. The result is a shorter unsettled gain period, only 6% of the bandwidth consumed, and only a 4 microsecond latency uncertainty added to other commands.

Figure 5:
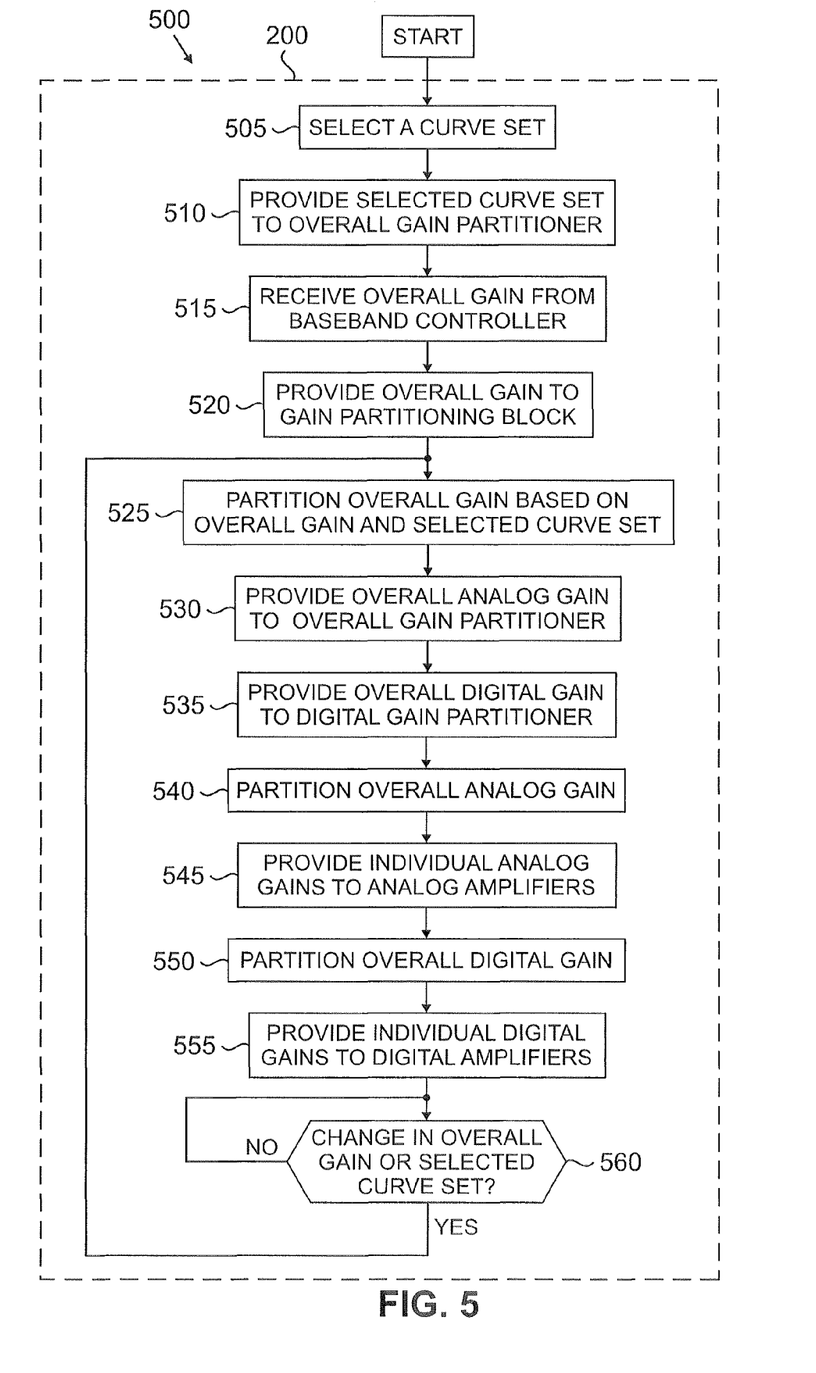
FIG. 5 is a flow diagram illustrating a method for partitioning gain in the RFIC of FIG. 2 according to one embodiment of the disclosure.

FIG. 5 is a flow diagram illustrating a method 500 for partitioning gain in the RFIC 200 according to one embodiment of the disclosure. Although the illustrated and described embodiment corresponds to the RFIC 200 illustrated in FIG. 2, it will be understood that a similar method may be implemented in other embodiments of the RFIC 200 without departing from the scope of the present disclosure. In addition, although described as discrete steps in a particular order, it will be understood that the steps of this method may be performed by the various components of the RFIC 200 based on signals received at each of the components when those signals are received.

Initially, the curve selector 305 selects a curve set 335 from a plurality of curve sets for use in gain partitioning (process step 505). The curve selector 305 provides the selected curve set 335 to the overall gain partitioner 310 (process step 510). It will be understood that, at any time, the curve selector 305 may select a different curve set 335 and provide the newly selected curve set 335 to the overall gain partitioner 310 (process steps 505 and 510). In addition, it will be understood that, for the embodiment in which the overall gain partitioner 310 stores a single curve set, steps 505 and 510 may be omitted.

The register 215 receives an overall gain 210 from the baseband controller 205 (process step 515). For a particular embodiment, the register 215 receives the overall gain 210 from the baseband controller 205 in a single transaction. The register 215 then provides the overall gain 210 to the gain partitioning block 220 (process step 520). For one embodiment, the register 215 provides the overall gain 210 to the overall gain partitioner 310 of the gain partitioning block 220. For another embodiment, the register 215 provides the overall gain 210 to the curve selector 305 of the gain partitioning block 220, and the curve selector 305 provides the overall gain 210 to the overall gain partitioner 310. For an alternative embodiment, the baseband controller 205 provides the overall gain 210 to the gain partitioning block 220 in process step 520, and process step 515 is omitted. In addition, it will be understood that, at any time, the register 215 may receive a different overall gain 210 from the baseband controller 205 and provide the newly received overall gain 210 to the gain partitioning block 220 (process steps 515 and 520).

Based on the overall gain 210 and the selected curve set 335 (or stored curve set), the overall gain partitioner 310 partitions the overall gain 210 into an overall analog gain 340 and an overall digital gain 345 (process step 525). The overall gain partitioner 310 provides the overall analog gain 340 to the analog gain partitioner 315 (process step 530) and the overall digital gain 345 to the digital gain partitioner 320 (process step 535).

The analog gain partitioner 315 partitions the overall analog gain 340 into individual analog gains 250 for the analog amplifiers 230 (process step 540) and provides an individual analog gain 250 to each analog amplifier 230 (process step 545). Similarly, the digital gain partitioner 320 partitions the overall digital gain 345 into individual digital gains 255 for the digital amplifiers 245 (process step 550) and provides an individual digital gain 255 to each digital amplifier 245 (process step 555).

At this point, the gain partitioning process is completed. However, because the curve selector 305 may select a different curve set 335 at any time and/or the baseband controller 205 may determine a new overall gain 210 for the RFIC 200 at any time, the overall gain partitioner 310 monitors the received signals to determine whether there has been any change in the overall gain 210 provided by the baseband controller 205 or the selected curve set 335 provided by the curve selector 305 (process step 560). If there has been a change in either or both of those, the overall gain partitioner 310 partitions the overall gain 210 into an overall analog gain 340 and an overall digital gain 345 based on the current overall gain 210 and the current selected curve set 335 (process step 525), and the method continues as before. However, if there has been no change in either the overall gain 210 or the selected curve set 335, the method remains at process step 560 until such a change is found.

In this way, the baseband controller 205 only has to determine an overall gain 210 for the RFIC 200, instead of individual gains 250 and 255 for each amplifier 230 and 245. This allows the baseband controller 205 to provide the gain information to the RFIC 200 in a single transaction. Using the gain partitioning block 220 of the RFIC 200 to partition the overall gain 210 also allows the amplifiers 230 and 245 to be updated simultaneously, minimizing latency in the control path.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for partitioning gain for a wireless radio frequency integrated circuit (RFIC), comprising:
    receiving an overall gain at the RFIC from a baseband controller coupled to the RFIC;
    partitioning the overall gain in the RFIC using the overall gain and at least one partitioning logic; and
    providing the partitioned overall gain to a plurality of amplifiers in the RFIC, the plurality of amplifiers comprising a plurality of analog amplifiers and a plurality of digital amplifiers all coupled in series.

2. The method as set forth in claim 1, partitioning the overall gain comprising partitioning the overall gain into an overall analog gain and an overall digital gain.

3. The method as set forth in claim 2, partitioning the overall gain further comprising partitioning the overall analog gain into a plurality of individual analog gains and partitioning the overall digital gain into a plurality of individual digital gains, providing the partitioned overall gain further comprising:
    providing each of the individual analog gains to a corresponding analog amplifier in the RFIC; and
    providing each of the individual digital gains to a corresponding digital amplifier in the RFIC.

4. The method as set forth in claim 3,
    providing each of the individual analog gains to a corresponding analog amplifier in the RFIC comprising providing each of the individual analog gains simultaneously to the analog amplifiers; and
    providing each of the individual digital gains to a corresponding digital amplifier in the RFIC comprising, simultaneously to providing each of the individual analog gains to the analog amplifiers, providing each of the individual digital gains simultaneously to the digital amplifiers.

5. The method as set forth in claim 2, further comprising selecting a curve set from a plurality of curve sets, partitioning the overall gain into the overall analog gain and the overall digital gain comprising partitioning the overall gain into the overall analog gain and the overall digital gain based on the selected curve set.

6. The method as set forth in claim 2, further comprising storing a single curve set, partitioning the overall gain into the overall analog gain and the overall digital gain comprising partitioning the overall gain into the overall analog gain and the overall digital gain based on the stored curve set.

7. The method as set forth in claim 1, receiving the overall gain at the RFIC from the baseband controller comprising receiving the overall gain in a single transaction.

8. A radio frequency integrated circuit (RFIC), comprising:
    a plurality of amplifiers comprising a plurality of analog amplifiers and a plurality of digital amplifiers all coupled in series; and
    a gain partitioning block coupled to the amplifiers, the gain partitioning block operable to receive an overall gain for the RFIC from a baseband controller and partition the overall gain into an individual gain for each of the amplifiers using the overall gain and at least one partitioning logic.

9. The RFIC as set forth in claim 8, the gain partitioning block comprising an overall gain partitioner operable to partition the overall gain into an overall analog gain and an overall digital gain.

10. The RFIC as set forth in claim 9, the gain partitioning block further comprising:
    an analog gain partitioner coupled to the overall gain partitioner and operable to partition the overall analog gain into an individual analog gain for each of the analog amplifiers; and
    a digital gain partitioner coupled to the overall gain partitioner and operable to partition the overall digital gain into an individual digital gain for each of the digital amplifiers.

11. The RFIC as set forth in claim 9, the overall gain partitioner operable to store a curve set and to partition the overall gain into the overall analog gain and the overall digital gain based on the stored curve set.

12. The RFIC as set forth in claim 9, the gain partitioning block further comprising a curve selector coupled to the overall gain partitioner, the curve selector operable to store a plurality of curve sets, to select one of the curve sets for use in gain partitioning and to provide the selected curve set to the overall gain partitioner, the overall gain partitioner operable to partition the overall gain into the overall analog gain and the overall digital gain based on the selected curve set.

13. The RFIC as set forth in claim 8, further comprising a register coupled to the gain partitioning block, the register operable to receive the overall gain from the baseband controller and to provide the overall gain to the gain partitioning block.

14. A mobile station, comprising:
    a baseband controller operable to determine an overall gain; and
    a radio frequency integrated circuit (RFIC) coupled to the baseband controller and comprising a gain partitioning block and a plurality of amplifiers, the plurality of amplifiers comprising a plurality of analog amplifiers and a plurality of digital amplifiers all coupled in series, the RFIC operable to receive the overall gain from the baseband controller, the gain partitioning block operable to partition the overall gain into an individual gain for each of the amplifiers using the overall gain and at least one partitioning logic.

15. The mobile station as set forth in claim 14, the gain partitioning block comprising an overall gain partitioner operable to partition the overall gain into an overall analog gain and an overall digital gain.

16. The mobile station as set forth in claim 15, the gain partitioning block further comprising:
   an analog gain partitioner coupled to the overall gain partitioner and operable to partition the overall analog gain into an individual analog gain for each of the analog amplifiers; and
   a digital gain partitioner coupled to the overall gain partitioner and operable to partition the overall digital gain into an individual digital gain for each of the digital amplifiers.

17. The mobile station as set forth in claim 15, the overall gain partitioner operable to store a curve set and to partition the overall gain into the overall analog gain and the overall digital gain based on the stored curve set.

18. The mobile station as set forth in claim 15, the gain partitioning block further comprising a curve selector coupled to the overall gain partitioner, the curve selector operable to store a plurality of curve sets, to select one of the curve sets for use in gain partitioning and to provide the selected curve set to the overall gain partitioner, the overall gain partitioner operable to partition the overall gain into the overall analog gain and the overall digital gain based on the selected curve set.

19. The mobile station as set forth in claim 14, the RFIC further comprising a register coupled to the gain partitioning block, the register operable to receive the overall gain from the baseband controller and to provide the overall gain to the gain partitioning block.

20. The mobile station as set forth in claim 14, the RFIC operable to receive the overall gain from the baseband controller in a single transaction.

\* \* \* \* \*